(12) United States Patent
Nomura et al.

(10) Patent No.: US 9,207,288 B2
(45) Date of Patent: Dec. 8, 2015

(54) ELECTRICAL CURRENT SENSOR

(71) Applicant: ALPS GREEN DEVICES CO., LTD., Tokyo (JP)

(72) Inventors: Masatoshi Nomura, Miyagi-ken (JP); Manabu Tamura, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 401 days.

(21) Appl. No.: 13/719,067

(22) Filed: Dec. 18, 2012

(65) Prior Publication Data

US 2013/0106412 A1  May 2, 2013

Related U.S. Application Data

(63) Continuation of application No. PCT/JP2011/059451, filed on Apr. 15, 2011.

(30) Foreign Application Priority Data

Jul. 20, 2010  (JP) ................. 2010-163156

(51) Int. Cl.
  *G01R 33/00* (2006.01)
  *G01R 33/02* (2006.01)
  *G01R 15/20* (2006.01)

(52) U.S. Cl.
  CPC .......... *G01R 33/0041* (2013.01); *G01R 15/205* (2013.01); *G01R 33/00* (2013.01); *G01R 33/02* (2013.01)

(58) Field of Classification Search
  CPC ....... G01R 15/205; G01R 33/02; G01R 33/09

USPC ................ 324/252; 320/49; 429/90
See application file for complete search history.

(56) References Cited

U.S. PATENT DOCUMENTS

| 5,287,058 A | 2/1994 | Goto et al. |
| 8,465,859 B2 * | 6/2013 | Murata et al. .................. 429/90 |
| 2013/0033260 A1 * | 2/2013 | Nomura ....................... 324/252 |

FOREIGN PATENT DOCUMENTS

| JP | 4-47283 | 2/1992 |
| JP | 4-353772 | 12/1992 |
| JP | 2003-344543 | 12/2003 |
| JP | 2007-78416 | 3/2007 |

OTHER PUBLICATIONS

Search Report dated Jul. 19, 2011 from International Application No. PCT/JP2011/059451.

* cited by examiner

*Primary Examiner* — Reena Aurora
(74) *Attorney, Agent, or Firm* — Beyer Law Group LLP

(57) ABSTRACT

An electrical current sensor includes a magnetic detection element whose characteristics are changed by an inductive magnetic field from a current to be measured, a plurality of coils that are connected in series with each other and which are arranged in the vicinity of the magnetic detection element, and generates a canceling magnetic field for canceling the inductive magnetic field by a feedback current flowing in the coils, and a switch circuit that selects a coil electrically connected with an input terminal and/or an output terminal of the feedback current from the plurality of coils, and controls a coil for allowing the feedback current to flow.

11 Claims, 7 Drawing Sheets

ELECTRICAL CURRENT SENSOR

CLAIM OF PRIORITY

This application is a Continuation of International Application No. PCT/JP2011/059451 filed on Apr. 15, 2011, which claims benefit of Japanese Patent Application No. 2010-163156 filed on Jul. 20, 2010. The entire contents of each application noted above are hereby incorporated by reference.

BACKGROUND OF THE INVENTION

1. Field of the Invention

The present invention relates to an electrical current sensor able to detect a current with high accuracy over a wide measuring range.

2. Description of the Related Art

In an electric vehicle, a motor is driven using electricity generated by an engine, and a magnitude of a current for driving the motor is detected by, for example, an electrical current sensor. As the current sensor, there is a magnetic proportional current sensor and a magnetic balance current sensor. In the case of the magnetic proportional current sensor, a magnetic field proportional to a current being measured, passes through a core gap due to magnetic force lines generated in a magnetic core, and a magnetic detection element converts the magnetic field into a voltage signal to thereby generate an output voltage proportional to the current to be measured. Meanwhile, in the case of the magnetic balance current sensor, when the current to be measured flows in the magnetic balance current sensor, an output voltage is generated in a magnetic detection element due to a magnetic field according to the current, and a voltage signal output from the magnetic detection element is converted into an electrical current to be fed back to a feedback coil, and a magnetic field (a canceling magnetic field) generated by the feedback coil and a magnetic field generated by the current to be measured are canceled out by each other so that the magnetic field is always zero. In this instance, the magnetic balance current sensor voltage-converts the feedback current flowing in the feedback coil to thereby be extracted as an output.

The magnetic balance current sensor using a Giant Magneto Resistance (GMR) element may have a more complex configuration than that of the magnetic proportional current sensor, but measures a current to be measured over a wide measuring range. However, it is necessary that accuracy of the measurement is uniform over the measuring range, and the number of turns of the feedback coil is generally fixed and selected so as to use the appropriate number of turns considering a measuring range or a consumption current according to applications, and therefore it is difficult to simultaneously perform measurement of a large current of a rated operating condition and measurement of a very small current such as a sleep current of a system with high accuracy. On the other hand, in the magnetic proportional current sensor, it is possible to perform measurement of the very small current with high accuracy by setting a narrow measuring range, but when assuming that measurement of a large current is also to be performed, it is necessary to extend the measuring range so that a GMR element is not saturated. However, when extending the measuring range, the resolution when the current to be measured is small is reduced, and it is difficult to perform measurement of the very small current with high accuracy.

With respect to such a problem, in order to perform current measurement with high accuracy over a wide detection range, a method in which a magnetic proportional current sensor using a Hall element and a magnetic balance current sensor using a Hall element are arranged, and used by switching them according to a magnitude of a current to be measured, has been disclosed (for example, see Japanese Unexamined Patent Application Publication No. 2007-78416).

However, in the technique disclosed in Japanese Unexamined Patent Application Publication No. 2007-78416, two different types of current sensors have to be provided. Due to this, space saving and cost reduction cannot be achieved, and manufacturing processes becomes complicated. In addition, in the technique disclosed in Japanese Unexamined Patent Application Publication No. 2007-78416, magnetic balance in the magnetic balance current sensor which is not used collapses when the current to be measured is large, and therefore magnetic saturation is caused when a GMR element is used as a magnetic detection element. Therefore, in the technique disclosed in Japanese Unexamined Patent Application Publication No. 2007-78416, it is difficult for the magnetic detection element to perform measurement with high accuracy over a wide measuring range.

SUMMARY OF THE INVENTION

The present invention provides a current sensor that enables measurement to be performed with high accuracy over a wide measuring range, and achieves space saving.

According to an aspect of the present invention, there is provided an electrical current sensor including: a magnetic detection element whose characteristics are changed due to an inductive magnetic field from a current to be measured; a plurality of coils that are connected in series with each other and which are arranged in the vicinity of the magnetic detection element, and generates a canceling magnetic field for canceling the inductive magnetic field by a feedback current flowing in the coils; and a switch circuit that selects a coil electrically connected with an input terminal and/or an output terminal of the feedback current from the plurality of coils, and controls a coil for allowing the feedback current to flow.

According to this configuration, by switching the number of coils (the number of turns) allowing the feedback current to flow in a single current sensor, it is possible to control a relation ratio between a coil current (feedback current) and a generated magnetic field (canceling magnetic field). Therefore, by controlling a measurement mode according to a value of the current to be measured, it is possible to perform measurement with high accuracy over a wide measuring range and to achieve low power consumption, and it is also possible to achieve space saving.

In the current sensor of the present invention, it is preferable that the current sensor further include a switch circuit control unit that controls the coil selected by the switch circuit based on a value of the current to be measured.

In the current sensor of the present invention, it is preferable that output side switches be respectively provided between an output unit of each coil and the output terminal, and that the switch circuit switches the output side switch.

In the current sensor of the present invention, it is preferable that input side switches be respectively provided between an input unit of each coil and the input terminal, and that the switch circuit switches the input side switch.

In the current sensor of the present invention, it is preferable that when switching the switch, the switch before switching should be put in the OFF state after both the switch before switching and the switch after switching have been put in the ON state.

In the current sensor of the present invention, it is preferable that in a coil arranged on one side surface of the magnetic detection element, the plurality of coils be formed by drawing the terminal out of a middle portion of the coil.

In the current sensor of the invention, it is preferable that the plurality of coils be formed by connecting in series coils respectively provided above and below the magnetic detection element.

In the current sensor of the present invention, it is preferable that the magnetic detection element be a magneto-resistance effect element.

According to the current sensor of the present invention, a magnetic balance coil is provided which is divided into a plurality of coils of two or more, and the divided coils are combined according to a value of a current to be measured to thereby be used, and therefore it is possible to control a relation ratio between a coil current and a generated magnetic field, and to perform measurement with high accuracy over a wide measuring range, and to achieve lower power consumption, and it is also possible to achieve space saving.

DESCRIPTION OF THE PREFERRED EMBODIMENTS

Figure 1:
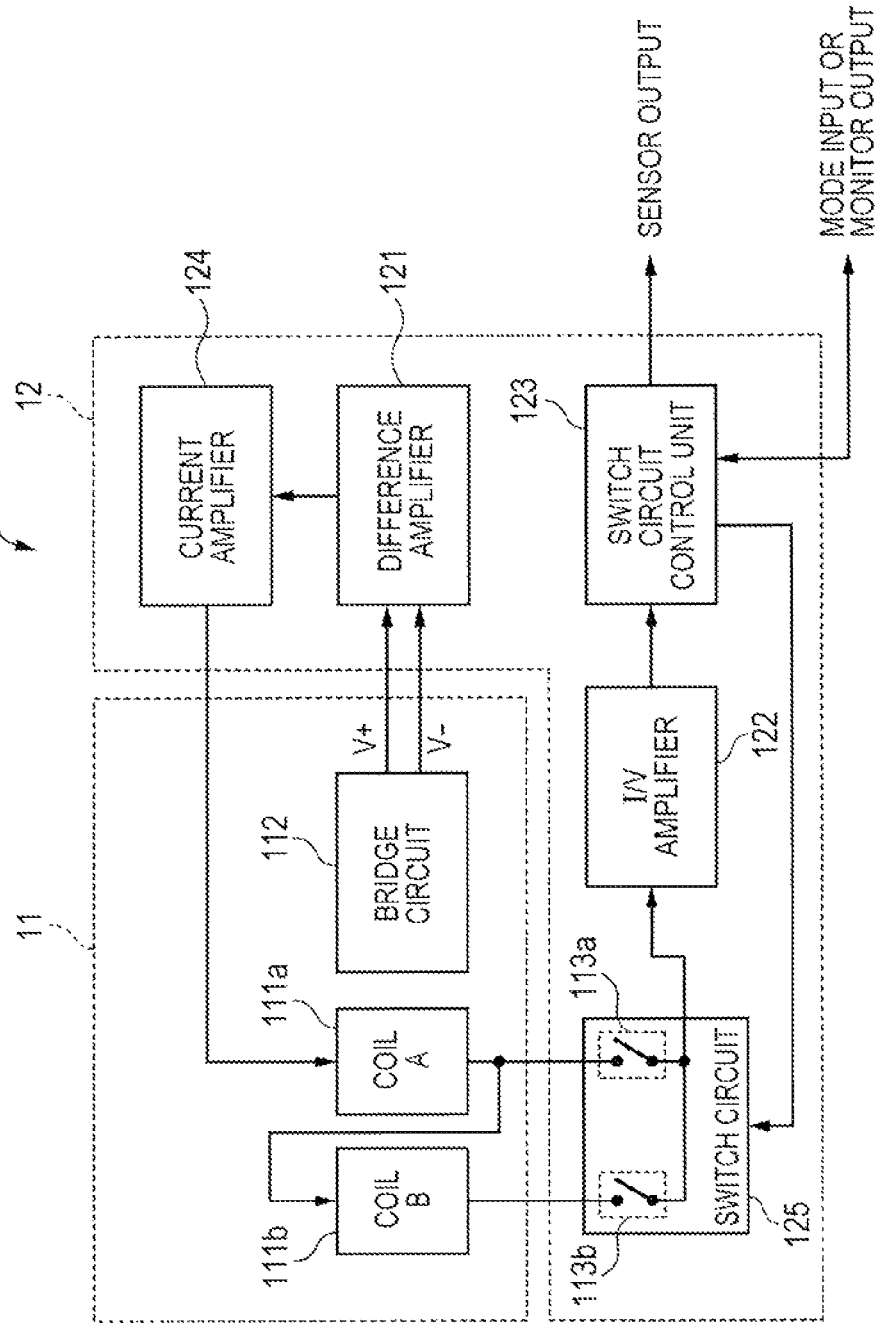
FIG. 1 is a drawing showing an example of an electrical current sensor according to a first embodiment of the present invention.

As described above, a magnetic balance current sensor using a GMR element has a more complex configuration than that of a magnetic proportional current sensor, but may measure a current over a wide measuring range. However, it is necessary that accuracy of the measurement is uniform over the measuring range, and the number of turns of a feedback coil is generally fixed and selected so as to use the appropriate number of turns considering a measuring range or a consumption current according to applications, and therefore it is difficult to simultaneously perform measurement of a large current of a rated operating condition and measurement of a very small current such as a sleep current of a system with high accuracy. As a method of performing measurement of the very small current with high accuracy, it is conceivable to reduce a relation ratio between a coil current (feedback current) and a generated magnetic field (canceling magnetic field) by reducing the number of turns of a coil, but there are problems that applications are limited, and a current flowing in the coil becomes larger when the current to be measured is relatively large, resulting in an increase in power consumption.

Focusing on the above points, the present inventors have found that, in a magnetic balance current sensor, a magnetic balance coil (feedback coil) is provided which is divided into a plurality of coils of two or more, and the divided coils are used which are combined according to a value of the current to be measured, and therefore it is possible to control a relation ratio between a coil current and a generated magnetic field. In particular, when the current to be measured is a very small current, measurement is performed with high accuracy by reducing the relation ratio between the coil current and the generated magnetic field, and when the current to be measured is equal to or larger than a predetermined value, setting is performed so as to reduce a current value by increasing the relation ratio between the coil current and the generated magnetic field, and therefore it is possible to switch measurement with high accuracy according to the current to be measured in a single current sensor and measurement in low power consumption.

In addition, in the magnetic proportional current sensor using the GMR element, the relatively small current to be measured may be measured with high accuracy in small power consumption, but when the current to be measured is large, the GMR element is magnetically saturated by its magnetic field, and an output value after the saturation deviates, so that the GMR element is not available, and a measuring range of the current to be measured is reduced. Meanwhile, when extending the measuring range, the resolution when the current to be measured is small is degraded, and it is difficult to perform measurement of the very small current with high accuracy.

Focusing on the above points, the present inventors have found that, in a magnetic proportional current sensor, a coil that generates a magnetic field for reducing an inductive magnetic field from a current to be measured is provided which is divided into a plurality of coils of two or more, and the plurality of coils are combined according to a value of the current to be measured to thereby be used, and therefore it is possible to suppress the GMR element from being magnetically saturated even when a magnitude of the current to be measured is changed, and to perform measurement of the current to be measured with high accuracy over a predetermined measuring range.

Hereinafter, embodiments of the present invention will be described in detail with reference to the accompanying drawings. In addition, in the following descriptions, a magnetic balance current sensor according to a first embodiment will be described, and a magnetic proportional current sensor according to a second embodiment will be described.

First Embodiment

FIG. 1 is a drawing showing an example of a magnetic balance current sensor according to a first embodiment of the present invention. In the present embodiment, an electrical current sensor 10 shown in FIG. 1 is arranged in the vicinity of a current line in which a current to be measured flows. The current sensor 10 is mainly composed of a sensor unit 11 and a control unit 12.

The sensor unit 11 includes a plurality of coils 111a and 111b which are arranged in such a manner that a magnetic field in a direction of canceling a magnetic field generated by the current to be measured may be generated, and a bridge circuit 112 including two magneto-resistance effect elements which are magnetic detection elements and two fixed resistance elements. The plurality of coils 111a and 111b are connected in series with each other to be arranged. In addition, in FIG. 1, a case in which two coils connected in series are provided has been shown, but at least three coils may be connected in series with each other to be provided.

The control unit 12 includes a differential amplifier 121 for amplifying a differential output of the bridge circuit 112, a current amplifier 124 for controlling a feedback current flowing in a coil, a switch circuit 125 for controlling a coil for allowing the feedback current to flow among the plurality of coils, an I/V amplifier 122 for converting the feedback current into a voltage, and a switch circuit control unit 123 for controlling a switch operation of the switch circuit 125.

Figure 2A:
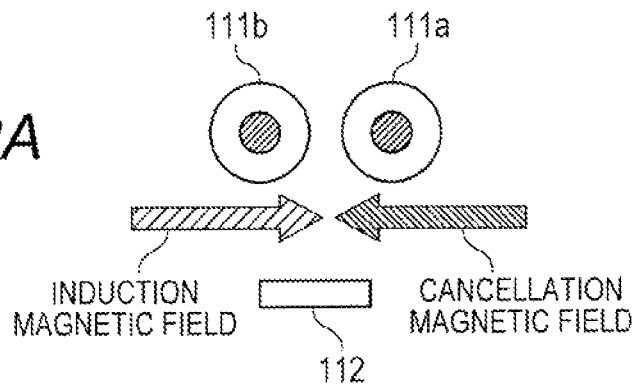
FIGS. 2A, 2B, and 2C are drawings showing a positional relationship between a magnetic detection element and a plurality of coils.
Figure 2B:
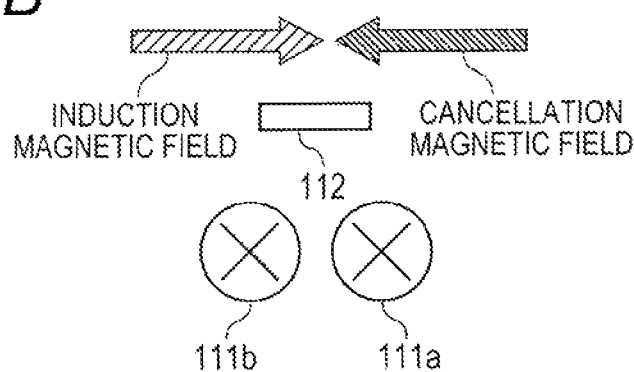
Figure 2C:
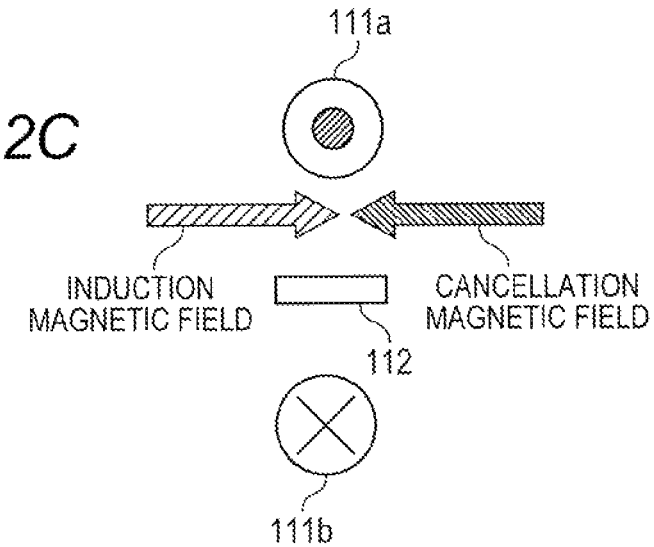

The coils 111a and 111b are connected in series with each other and are arranged in the vicinity of the magneto-resistance effect element of the bridge circuit 112, and generate a canceling magnetic field for canceling an inductive magnetic field generated by the current to be measured. As to disposition of the plurality of coils connected in series, the plurality of coils may be arranged on one surface side of a magnetic detection element (see FIGS. 2A and 2B), and the coils may be provided respectively arranged above and below the magnetic detection element and connected in series (see FIG. 2C). For example, as to a configuration in which the plurality of coils are provided on one surface side of the magnetic detection element, the plurality of coils which are connected in series are obtained by drawing a terminal out of a middle portion (for example, a midpoint of coil winding of the coil) in the coil arranged on one side surface of the magnetic detection element. Specifically, in a coil in which the number of turns of the coil is 20, it is possible to draw a terminal out of a midpoint (a middle portion in which the number of turns is 10).

The bridge circuit 112 may be composed of a magneto-resistance effect element such as a Giant Magneto Resistance (GMR) element, a Tunnel Magneto Resistance (TMR) element, or the like. In the magneto-resistance effect element, a resistance value is changed by application of the inductive magnetic field from the current to be measured. The bridge circuit 112 is composed of two magneto-resistance effect elements and two fixed resistance elements, and therefore a current sensor with high sensitivity may be realized. By using the magneto-resistance effect element, a sensitivity axis is easily arranged in a direction parallel to a substrate surface on which the current sensor is provided, and a planar coil may be used.

In addition, the bridge circuit 112 includes two outputs for producing a voltage difference according to the inductive magnetic field generated by the current to be measured. The two outputs of the bridge circuit 112 are amplified in the differential amplifier 121. The amplified outputs are applied to the coil 111a and/or the coil 111b as a current (feedback current) by the current amplifier 124. The feedback current corresponds to the voltage difference according to the inductive magnetic field. In this instance, a canceling magnetic field for canceling the inductive magnetic field is generated in the coil 111a and/or the coil 111b. Next, a current flowing in the coil 111a and/or the coil 111b in the equilibrium state where the inductive magnetic field and the canceling magnetic field are canceled is converted into a voltage in the I/V amplifier 122, and a sensor output is determined based on a switching state of the voltage and the switch circuit 125.

In addition, here, the differential of the two outputs of the bridge circuit 112 is amplified to be used as the feedback current, but only a midpoint potential from the bridge circuit 112 may be used as an output, and may be used as the feedback current based on a potential difference with a predetermined reference potential.

The switch circuit 125 selects a coil for allowing the feedback current to flow from the plurality of coils (here, the coils 111a and 111b). Specifically, output side switches (here, the switches 113a and 113b) are respectively provided between an output unit of the coils 111a and 111b and an output terminal (in FIG. 1, I/V amplifier 122) through which the feedback current is output, and control on/off of the switch.

For example, in FIG. 1, when a switch 113a between the output unit of the coil 111a and the output terminal of the feedback current is turned on, and a switch 113b between the output unit of the coil 111b and the output terminal of the feedback current is turned off, the feedback current flows only in the coil 111a. Meanwhile, when the switch 113a between the output unit of the coil 111a and the output terminal of the feedback current is turned off, and the switch 113b between the output unit of the coil 111b and the output terminal of the feedback current is turned on, the feedback current flows in both the coil 111a and the coil 111b.

In this manner, the switch is provided between the output unit of each coil connected in series and the output terminal of the feedback current to thereby control a switching state, and therefore it is possible to control a relation ratio between a coil current and a generated magnetic field by switching the number of coils (the number of turns of the coils) for allowing the feedback current to flow. As the switch, a switch of which on and off is controlled may be used, and for example, the switch may be composed of a switching element such as FET. In addition, when the FET or the like is provided as the switch, a resistance of an on-resistance is applied to the circuit, and a voltage is changed, but the current sensor shown in the present embodiment detects a current flowing in the coil as an output of the sensor. Therefore, even though the switch is provided, it is possible to perform measurement without affecting the sensor output. In addition, switching of the switch in the switch circuit 125 may be controlled from various points of view, and may be performed based on, for example, a value of the current to be measured.

The switch circuit control unit 123 controls the switching of the switch circuit 125 based on the value of the current to be measured and the like, and controls switching of a coil for allowing the feedback current to flow. For example, in FIG. 1, when the value of the current to be measured is less than a predetermined value (threshold value), the switch circuit control unit 123 controls (the switch 113a is turned on, and the switch 113b is turned off) the switching of the switch so that the feedback current flows in only the coil 111a among the plurality of coils, and switches to a mode (a measurement mode with high accuracy) for performing current measurement with high accuracy by reducing (by reducing a generated magnetic field corresponding to the same coil current) a relation ratio between a coil current and a generated magnetic field. Meanwhile, when the value of the current to be measured is equal to or larger than a threshold value, the switch circuit control unit 123 controls (the switch 113a is turned off and the switch 113b is turned on) the switching of the switch so that the feedback current flows in both the coil 111a and the coil 111b, and switches to a mode (a measurement mode in a low power consumption) for performing current measurement in a low power consumption by increasing (by increasing the generated magnetic field corresponding to the same coil current) the relation ratio between the coil current and the generated magnetic field. Therefore, it is possible to control the measurement mode according to the value of the current to be measured, and therefore it is possible to perform measurement with high accuracy over a wide measuring range and to achieve lower power consumption.

Figure 3:
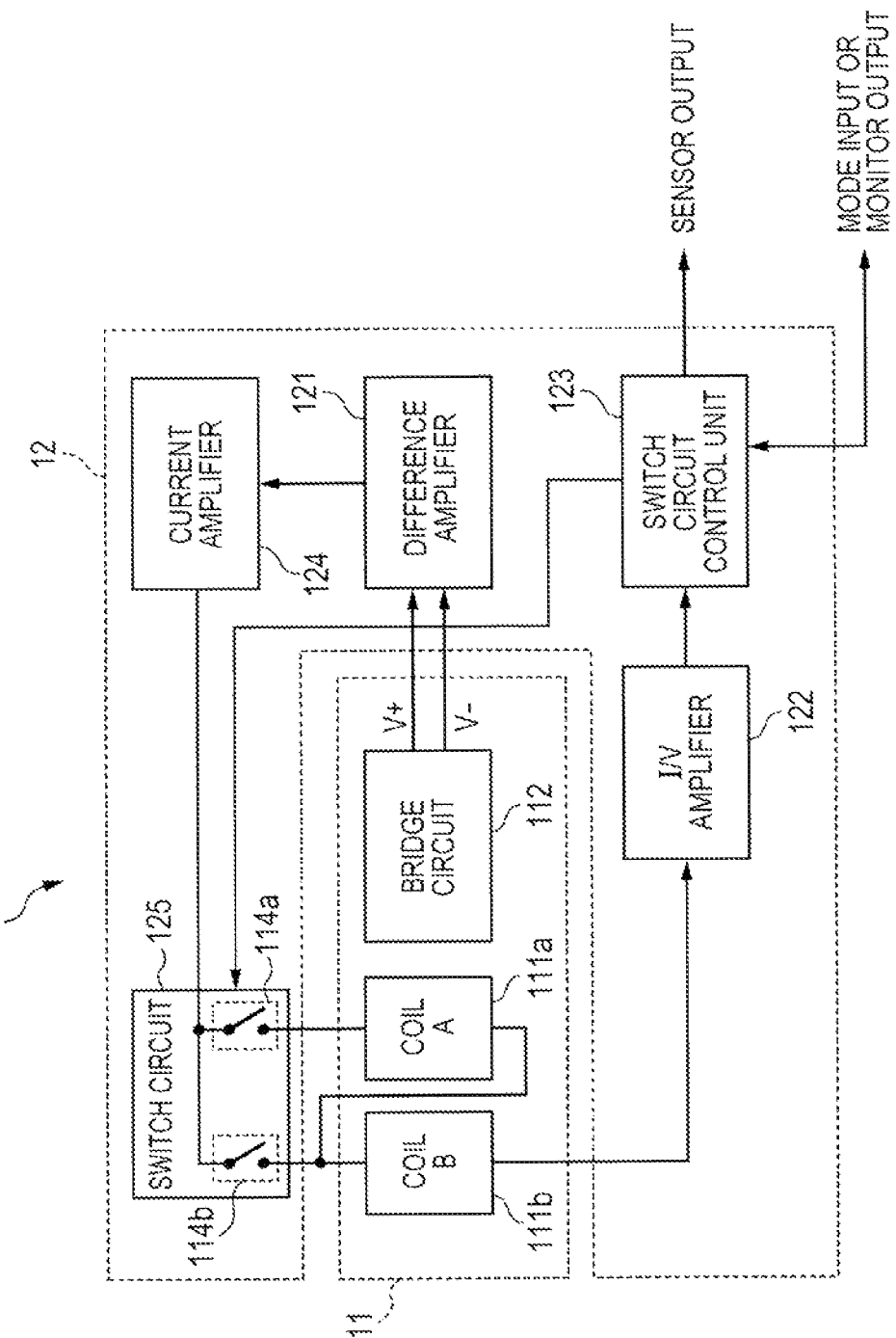
FIG. 3 is a drawing showing an example of an electrical current sensor according to the first embodiment of the present invention.

In addition, in FIG. 1, a case in which the switches are respectively provided, as the switch circuit 125, between the output unit of the coils 111a and 111b and the output terminal (in FIG. 1, I/V amplifier 122) of the feedback current has been shown, but a position where the switch is provided is not limited thereto. As shown in FIG. 3, a configuration in which input side switches (here, switches 114a and 114b) are respectively provided, as the switch circuit 125, between the input unit of the coils 111a and 111b and an input terminal through which the feedback current is input (in FIG. 1, current amplifier 124) may be adopted.

Figure 4:
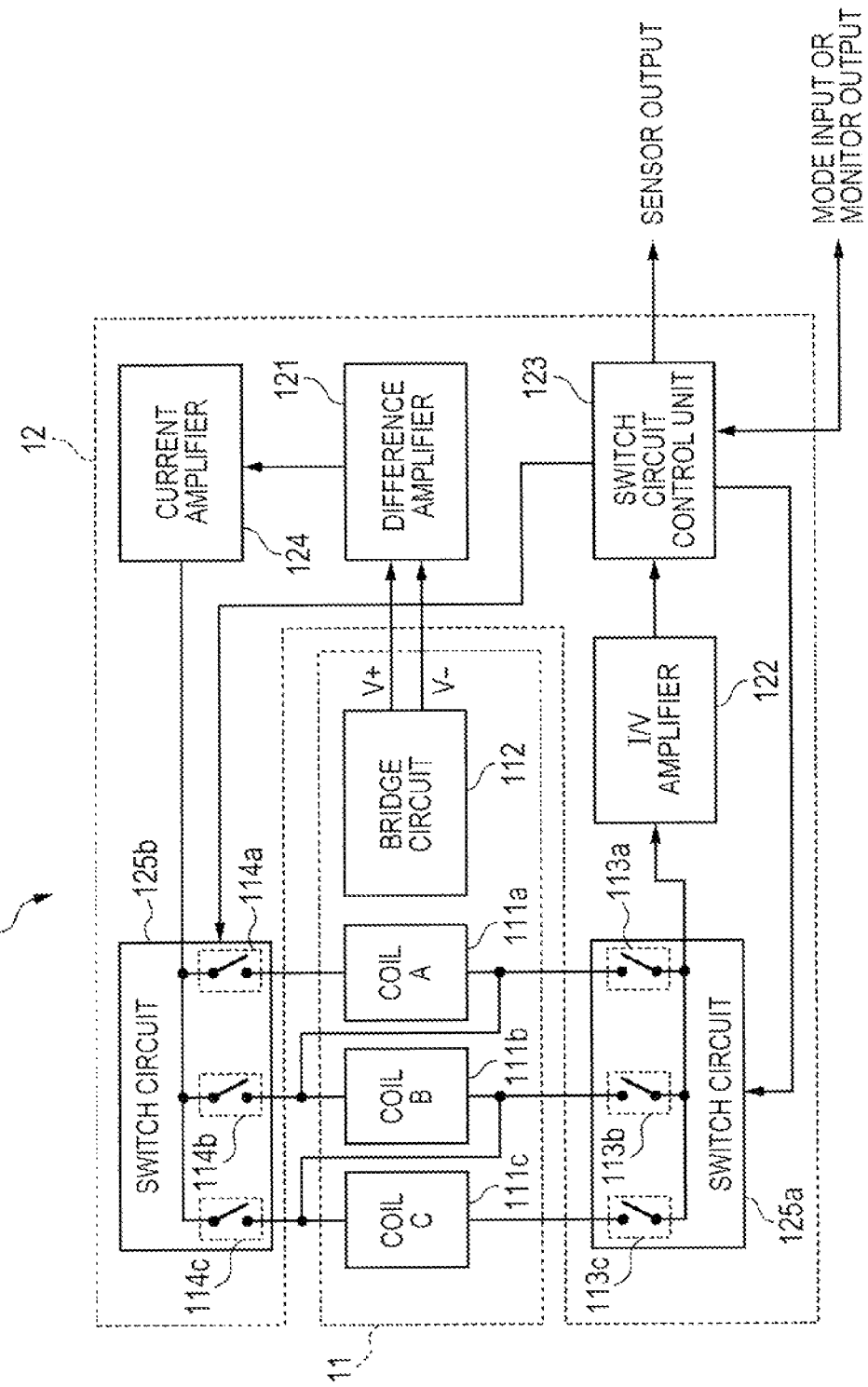
FIG. 4 is a drawing showing an example of an electrical current sensor according to the first embodiment of the present invention.

In addition, as shown in FIG. 4, a configuration in which the switches 113a to 113c and the switches 114a to 114c are respectively provided between the output unit of the coils 111a to 111c and the output terminal of the feedback current (in FIG. 1, I/V amplifier 122) and between the input unit of the coils 111a to 111c and the input terminal of the feedback current (in FIG. 1, current amplifier 124) may be adopted. As shown in FIG. 4, the switch circuits 125a and 125b are provided in both the input terminal and output terminal of the feedback current, and therefore it is possible to freely set a combination of the coils for allowing the feedback current to flow. In the current sensor shown in FIG. 1 (or FIG. 3), a configuration in which the feedback current always flows in a coil A (or coil B) connected with the input terminal (or output terminal) of the feedback current is adopted, but in the current sensor shown in FIG. 4, it is possible to finely control the coil for allowing the feedback current to flow. In particular, when the number of the provided coils is increased, by adopting the configuration shown in FIG. 4, it is possible to finely set the relation ratio between the coil current and the generated magnetic field.

In addition, when switching the switch in the switching circuit shown in FIGS. 1, 3, and 4, a configuration of avoiding a state in which all switches are turned off (are cut simultaneously) is preferably adopted. This is because it is impossible to generate the feedback magnetic field from the coil when all switches are turned off, and a large inductive magnetic field is applied to the magnetic detection element.

For example, in the switch circuit 125 shown in FIG. 1, when, in a state in which the switch 113a between the output unit of the coil 111a and the output terminal of the feedback current is turned on, and the switch 113b between the output unit of the coil 111b and the output terminal of the feedback current is turned off, the switch 113a is turned off and the switch 113b is turned on, the switch 113b is turned on (a state in which both the switches 113a and 113b are turned on), and then the switch 113a is turned off. Therefore, it is possible to suppress application of a large magnetic field to the GMR element while avoiding the state (is cut simultaneously) in which all switches in the switch circuit 125 are turned off.

In addition, the switch circuit control unit 123 may control switching of the switch of the switch circuit 125 by external signals. Therefore, at the timing when a user wishes to reduce power consumption such as a sleep mode, it is possible to reduce power consumption of the current sensor by switching the switch so that the feedback current flows in the large number of coils. In this case, mode signals are input from the outside to the switch circuit control unit 123 (mode input). In this instance, in the case of the current to be measured such that the GMR element is magnetically saturated, it is desirable to provide a protection function such that the mode is not actually switched.

In addition, when automatically performing mode switching, the switch circuit control unit 123 may be configured so as to output, to the outside, information (signal indicating whether a measurement mode with high accuracy or measurement mode in low power consumption is operated) as to in which mode the current to be measured is measured. Therefore, it is possible to confirm in which mode the current sensor is currently operated. In this case, the switch circuit control unit 123 is configured so as to be connectable to an external monitor. In addition, when automatically performing mode switching, the switch circuit control unit 123 may perform threshold value determination with respect to the current to be measured as described above, perform mode switching based on the result of the determination, and perform mode switching based on information from a device in which the current sensor is mounted.

Figure 5:
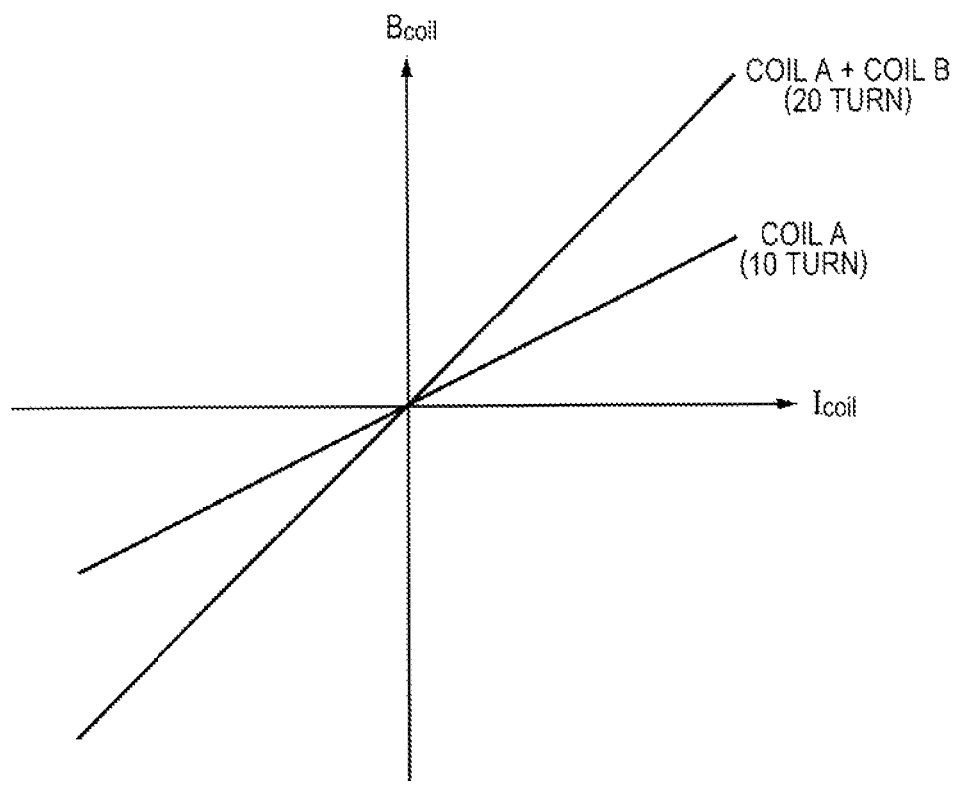
FIG. 5 is a drawing showing a relationship between a coil current and a generated magnetic field in a current sensor according to the first embodiment of the present invention.

Here, an example of switching the number of coils for allowing the feedback current to flow using the current sensor according to the first embodiment will be described. FIG. 5 shows a relation between a coil current (feedback current) of the case of using the GMR element and a generated magnetic field (canceling magnetic field). FIG. 5 shows a relation between a coil current and a generated magnetic field in a case in which a feedback current flows in a coil A of which the number of turns is 10 and in a case in which the coil A and a coil B of which the number of turns is 10 are connected in series with each other and the feedback current flows in both the coils A and B.

As shown in FIG. 5, when reducing the number of coils (reducing the number of turns of coils) for allowing the feedback current to flow, a relation ratio between the coil current and the generated magnetic field may be reduced, and a generated magnetic field corresponding to the same coil current may be reduced. Consequently, in a case in which the feedback current flows only in the coil A, the relation ratio between the coil current and the generated magnetic field may be reduced, a measuring range is reduced, and at the same time, it is possible to measure a primary current with higher accuracy. On the other hand, when the feedback current flows in both the coil A and the coil B, it is possible to increase (increase a generated magnetic field corresponding to the same coil current) the relation ratio between the coil current and the generated magnetic field, thereby reducing power consumption in the current sensor.

Subsequently, as shown in FIG. 5, when two coils of which the number of turns is the same are provided, an example of the timing when switching the coil for allowing the feedback current to flow will be described.

In a case of assuming that a maximum value of a current flowing in the coil is 20 mA, the 20 mA flows in both (the number of turns is 20) the coil A and the coil B, when a primary current 1000 A is designed so as to be measured (magnetic field becomes zero), sensitivity is 1000 A/20 mA=50 mA/μA. Meanwhile, when the feedback current flows only in the coil A by switching the switch, the sensitivity is 500 A/20 mA=25 mA/μA. Here, in a case of assuming that control accuracy of the feedback current in the coil is 1 μA, and required accuracy of the current sensor is 1%, when the measuring current becomes smaller than 5 A at the time of operating in 1000 A scale, required accuracy may not be retained in the case of using both the coil A and the coil B (the number of turns is 20). Therefore, in a range where the current to be measured is equal to or less than 5 A, a configuration in which the feedback current flows only in the coil A by switching the switch in the switch circuit is adopted, and therefore it is possible to ensure the required accuracy in the range where the measured current is up to 2.5 A.

In this case, it is preferable that a threshold value for switching the number of coils (the number of turns of coils) for allowing the feedback current to flow be set so as to have hysteresis between 5 A to 500 A of the measured current. For example, when a current close to 1000 A flows at the peak, but a current value is about 100 A at the normal time, a configuration in which the feedback current flows in both the coil A and the coil B (the total number of turns is 20) in a range in which the current value is sufficiently larger than 100 A and sufficiently smaller than 500 A (for example, a case in which the current is increased to exceed 300 A) is adopted, and when the current value is reduced to be equal to or less than 200 A, a configuration in which the feedback current flows only in the coil A (the total number of turns is 10) is adopted. In this manner, by setting the threshold value, the current sensor may be operated without performing frequent switching.

In addition, in the above-described example, the case in which two coils of which the number of turns is the same are provided has been described, but the invention is not limited thereto. It is preferable that the number of turns of each coil be set, and be appropriately combined to thereby operate the current sensor so that the total number of turns of a case in which the plurality of coils are combined according to applications may be set, and accuracy in the measurement of a desired small current may be ensured.

In this manner, according to the current sensor shown in the first embodiment, the number of coils (the number of turns) for allowing the feedback current to flow in a single current sensor may be switched, and therefore it is possible to control the measurement mode according to the value of the current to be measured. Therefore, it is possible to perform measurement with high accuracy and achieve lower power consumption.

Second Embodiment

In a second embodiment, a magnetic proportional current sensor will be described. In addition, detailed description of the same configuration as that of the above-described first embodiment will be omitted.

Figure 6:
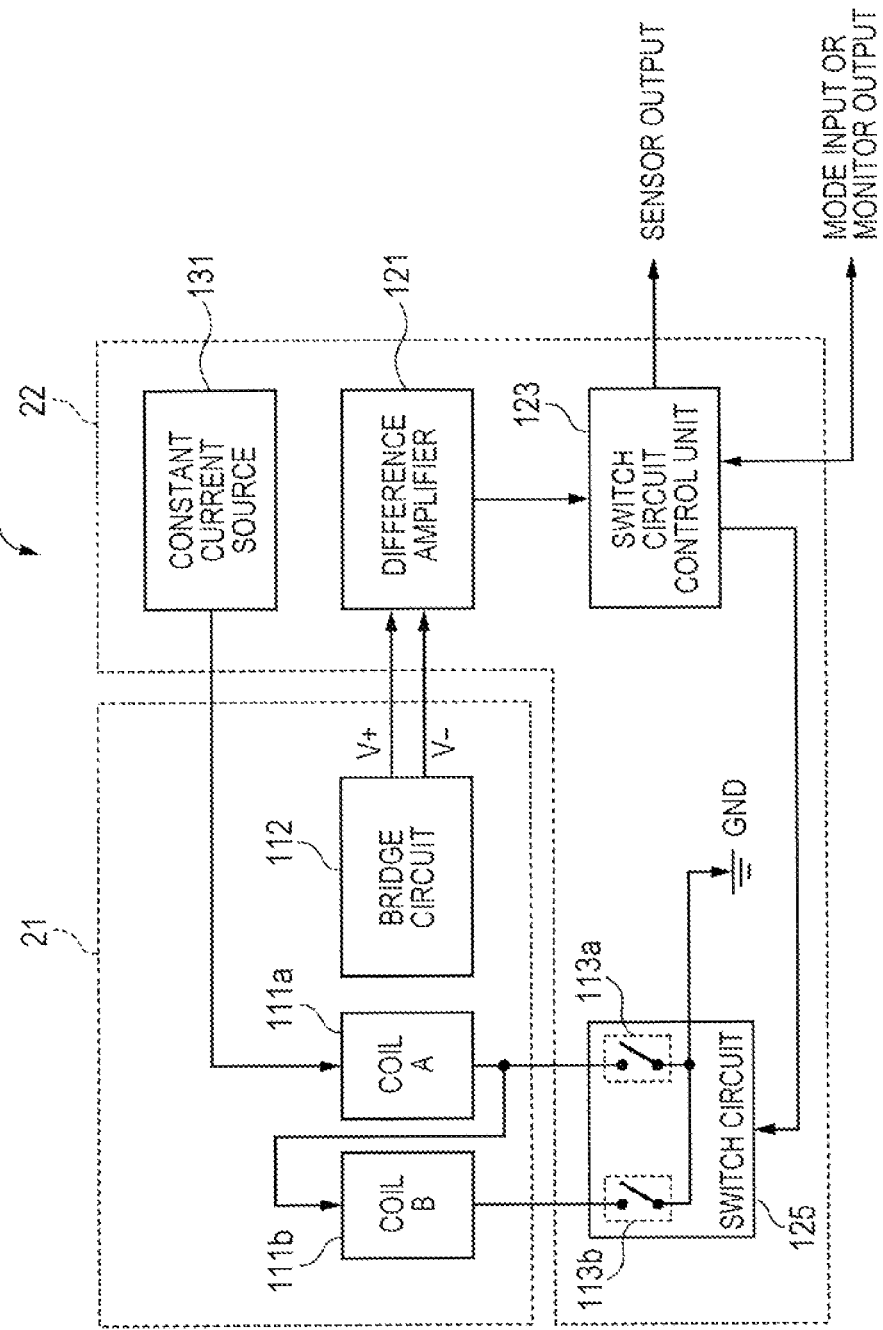
FIG. 6 is a drawing showing an example of an electrical current sensor according to a second embodiment of the present invention.

FIG. 6 is a drawing showing a magnetic proportional current sensor according to a second embodiment. The current sensor 20 shown in FIG. 6 is arranged in the vicinity of a current line through which a current to be measured flows. The current sensor 20 is mainly composed of a sensor unit 21 and a control unit 22.

The sensor unit 21 includes a plurality of coils 111a and 111b which are arranged so that a magnetic field for reducing a magnetic field generated by the current to be measured may be generated, and a bridge circuit 112 including two magneto-resistance effect elements which are magnetic detection elements and two fixed resistance elements. The plurality of coils 111a and 111b are connected in series with each other to be arranged. In addition, in FIG. 6, a case in which two coils are provided is shown, but at least three coils may be connected in series with each other to be provided.

The control unit 22 includes a differential amplifier 121 for amplifying a differential output of the bridge circuit 112, a constant current source 131 for supplying a predetermined current to a coil, a switch circuit 125 for controlling a coil for allowing a current supplied from the constant current source 131 to flow among the plurality of coils, and a switch circuit control unit 123 for controlling a switch operation of the switch circuit 125.

The coils 111a and 111b are connected in series with each other and are arranged in the vicinity of the magneto-resistance effect element of the bridge circuit 112, and generate a magnetic field for reducing an inductive magnetic field generated by the current to be measured. By allowing a current for canceling the inductive magnetic field generated by the current to be measured to thereby make zero to flow in the coils 111a and 111b, the current sensor according to the present embodiment performs measurement of the current to be measured based on an output voltage from the magnetic detection element, rather than performing measurement of the current to be measured based on a coil current. In addition, the current sensor selects a coil for allowing a current (constant current) supplied from the constant current source 131 to flow among the plurality of coils, and reduces the magnetic field generated by the current to be measured, so that the output voltage of the magnetic detection element is retained over a predetermined range.

The bridge circuit 112 includes two outputs for producing a voltage difference according to the inductive magnetic field generated by the current to be measured and the magnetic field generated from the coils 111a and/or 111b. The two outputs of the bridge circuit 112 are amplified in the differential amplifier 121. The amplified outputs are applied to the switch circuit control unit 123, and a sensor output is determined based on the output from the differential amplifier 121 and a switching state of the switch circuit 125.

The switch circuit 125 controls a coil for allowing the current supplied from the constant current source 131 among the plurality of coils (here, the coils 111a and 111b) to flow. Specifically, switches 113a and 113b are provided between an output unit of the coils 111a and 111b and an output terminal (In FIG. 6, the ground (GND)) of the feedback current, thereby controlling on/off of the switch.

For example, when the switch 113a between the output unit of the coil 111a and the output terminal of the feedback current is turned on, and the switch 113b between the output unit of the coil 111b and the output terminal of the feedback current is turned off, a constant current flows only in the coil 111a. On the other hand, when the switch 113a between the output unit of the coil 111a and the output terminal of the feedback current is turned off, and the switch 113b between the output unit of the coil 111a and the output terminal of the feedback current is turned on, the constant current flows in both the coil 111a and the coil 111b. In addition, when both the switches 113a and the switch 113b are turned off, the sensor unit 21 may measure the magnetic field generated by the current to be measured while the constant current does not flow in the coils 111a and 111b.

In this manner, by providing and controlling the switch between the output unit of the plurality of coils connected in series and the output terminal of a constant current, the number of coils (the number of turns of coils) for allowing the constant current to flow may be switched, and therefore it is possible to suppress saturation of the GMR element, and to set a current detected by the current sensor in a predetermined range.

The switch circuit control unit 123 controls switching of the switch circuit 125 based on a value of the current to be measured, and switches the number of coils for allowing the current from the constant current source 131 to flow. For example, in FIG. 6, when the value of the current to be measured is equal to or larger than a predetermined value (a first threshold value), the switch circuit control unit 123 controls the switching of the switch (the switch 113a is turned on, and the switch 113b is turned off) so that the constant current flows only in the coil 111a, and when the value of the current to be measured is equal to or larger than a high value (a second threshold value), the switch circuit control unit 123 controls the switching of the switch (the switch 113a is turned off, and the switch 113b is turned on) so that the constant current flows in both the coil 111a and the coil 111b. Therefore, even when the current to be measured is large, it is possible to suppress magnetic saturation of the GMR element due to a magnetic field of the current to be measured, and to perform measurement with high accuracy over a predetermined range.

In addition, in FIG. 6, as the switch circuit 125, the case in which the switches are respectively provided between the output unit of the coils 111a and 111b and the output terminal (in FIG. 6, GND) of a constant current has been shown, but the invention is not limited thereto. As shown in FIG. 3 of the above-described first embodiment, a configuration in which switches are respectively provided between an input unit of the coils 111a and 111b and an input terminal (in FIG. 6, the constant current source 131) of a constant current may be adopted, and as shown in FIG. 4, a configuration in which the switch circuits 125a and 125b are provided in both the input terminal and the output terminal of the constant current may be adopted.

In addition, when switching of the switch is performed in the switch circuit 125 shown in FIG. 6, it is preferable to perform the switching of the switch while avoiding a state (is cut simultaneously) in which all switches are turned off. This is because, when all switches are turned off, it is impossible to generate the magnetic field for reducing the magnetic field generated by the current to be measured from the coil, a large inductive magnetic field is added to the magnetic detection element, and the GMR element is magnetically saturated.

For example, in the switch circuit 125 shown in FIG. 6, when the switch 113a between the output unit of the coil 111a and the output terminal of the constant current is turned off and the switch 113b between the output unit of the coil 111b and the output terminal of the constant current is turned on in a state in which the switch 113a between the output unit of the coil 111a and the output terminal of the constant current is turned on and the switch 113b between the output unit of the coil 111b and the output terminal of the constant current is turned off, the switch 113b is turned on (both the switch 113a and the switch 113b are turned on), and then the switch 113a is turned off. Therefore, by adding a large magnetic field to the GMR element, it is possible to suppress saturation of the GMR element, and perform measurement with high accuracy.

Figure 7:
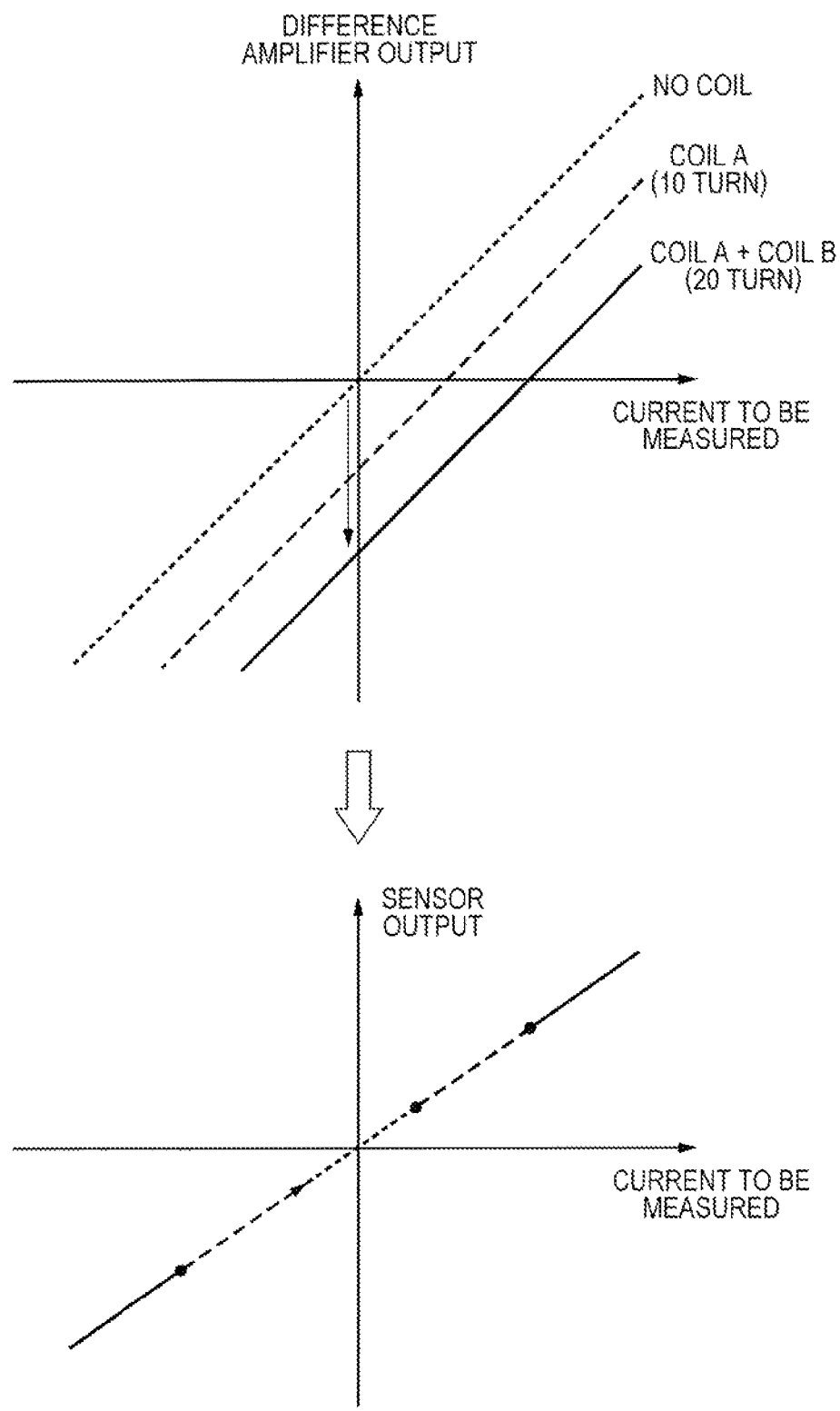
FIG. 7 is a drawing showing a relationship between a measured current and a differential amplifier output in a current sensor according to the second embodiment of the present invention.

Here, an example of switching the number of coils for allowing the constant current to flow using the magnetic proportional current sensor shown in the second embodiment will be described. In FIG. 7, an example of a relation between a measured current and a differential amplifier output when using the GMR element and a sensor output when using the GMR element is shown.

As shown in FIG. 7, by increasing the number of coils (the number of turns) for allowing the constant current to flow, it is possible to shift the differential amplifier output in the negative direction. Consequently, by controlling the number of coils (the number of turns) for allowing the constant current to flow according to the current to be measured, it is possible to suppress saturation of the GMR. In addition, in the switch circuit control unit 123, by measuring the sensor output according to a switching state of the switch circuit 125, it is possible to measure the current to be measured with high accuracy in a wide range.

In this manner, according to the magnetic proportional current sensor shown in the second embodiment, the number of coils (the number of turns) for allowing the constant current to flow according to the current to be measured in a single current sensor may be switched, and therefore it is possible to suppress saturation of the GMR, and perform measurement with high accuracy in a wide range.

The present invention is not limited to the above-described first and second embodiments, and may be changed in a variety of manners to thereby be carried out. For example, a connection relation, a size, or the like of each element in the above-described first and second embodiment may be appropriately changed to thereby be carried out. In addition, in the above-described embodiments, the case in which the magneto-resistance effect element is used as the magnetic detection element has been described, but a Hall element or other magnetic detection elements may be used. In addition, the present invention may be appropriately changed to thereby be carried out without departing from the scope of the present invention.

The present invention may be applied to an electrical current sensor for detecting a magnitude of a current for driving a motor of an electric vehicle or a hybrid car.

It should be understood by those skilled in the art that various modifications, combinations, sub-combinations and alterations may occur depending on design requirements and other factors insofar as they are within the scope of the appended claims of the equivalents thereof.

What is claimed is:

1. An electrical current sensor, comprising:
   a magnetic detection element whose characteristics are changed by an inductive magnetic field applied from a current to be measured flowing through a conductor;
   a feed back coil provided in a vicinity of the magnetic detection element, the feedback coil including a plurality of coils coupled in series with each other, the feedback coil generating a canceling magnetic field for canceling the inductive magnetic field by a feedback current flowing therethrough; and
   a switch circuit configured to selectively electrically connect one of the plurality of coils to either an input terminal or an output terminal of the feedback current, or to both of the input and output terminals of the feedback current so as to control a path of the feedback current flowing through the feedback coil.

2. The electrical current sensor according to claim 1, further comprising:
   a switch circuit control unit configured to control the switch circuit based on a value of the current to be measured.

3. The electrical current sensor according to claim 1, wherein the switch circuit includes:
   a plurality of output side switches each provided between an output terminal of respective one of the plurality of coils and the output terminal of the feedback current.

4. The electrical current sensor according to claim 3, wherein when a first output side switch is to be turned OFF and a second output side switch is to be turned ON, the second output side switch is turned ON before the first output side switch is turned OFF.

5. The electrical current sensor according to claim 1, wherein the switch circuit includes:
   a plurality of input side switches each provided between an input terminal of respective one of the plurality of coils and the input terminal of the feedback current.

6. The electrical current sensor according to claim 5, wherein when a first input side switch is to be turned OFF and a second input side switch is to be turned ON, the second input side switch is turned ON before the first input side switch is turned OFF.

7. The electrical current sensor according to claim 1, wherein the plurality of coils are provided by forming an intermediate output terminal in a middle portion of the feedback coil, the feedback coil being provided on a surface of the magnetic detection element.

8. The electrical current sensor according to claim 1, wherein the feedback coil is formed by connecting in series the plurality of coils provided above and below the magnetic detection element.

9. The electrical current sensor according to claim 1, wherein the magnetic detection element is a magneto-resistance effect element.

10. The electrical current sensor according to claim 1, wherein the switch circuit controls a number of the coils through which the feedback current flows within the feedback coil.

11. The electrical current sensor according to claim 1, wherein the switch circuit controls a combination of the coils through which the feedback current flows within the feedback coil.

* * * * *